US009297076B2

(12) United States Patent  
Dickey

(10) Patent No.: US 9,297,076 B2  
(45) Date of Patent: Mar. 29, 2016

(54) SUBSTRATE TRANSPORT MECHANISM CONTACTING A SINGLE SIDE OF A FLEXIBLE WEB SUBSTRATE FOR ROLL-TO-ROLL THIN FILM DEPOSITION

(75) Inventor: Eric R. Dickey, Portland, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 940 days.

(21) Appl. No.: 13/189,018

(22) Filed: Jul. 22, 2011

(65) Prior Publication Data

US 2012/0021128 A1 Jan. 26, 2012

Related U.S. Application Data

(60) Provisional application No. 61/366,927, filed on Jul. 23, 2010.

(51) Int. Cl.
*C23C 16/54* (2006.01)
*C23C 14/56* (2006.01)
*C23C 16/455* (2006.01)

(52) U.S. Cl.
CPC .......... *C23C 16/545* (2013.01); *C23C 16/45551* (2013.01); *C23C 16/45555* (2013.01)

(58) Field of Classification Search
CPC .................. C23C 16/45551; C23C 16/45555; H01L 21/67155; H01L 21/67161; H01L 21/67167; H01L 21/67173; H01L 21/67184; H01L 21/67196; H01L 21/67703
See application file for complete search history.

(56) References Cited

U.S. PATENT DOCUMENTS

| 1,350,662 | A | * | 8/1920 | MacDonald ............... 242/364.2 |
| 4,058,430 | A | | 11/1977 | Suntola et al. |
| 5,013,416 | A | * | 5/1991 | Murayama et al. .......... 427/525 |
| 5,460,853 | A | | 10/1995 | Hintz et al. |
| 5,514,217 | A | | 5/1996 | Niino et al. |
| 6,186,090 | B1 | | 2/2001 | Dotter, II et al. |
| 6,821,563 | B2 | | 11/2004 | Yudovsky |
| 6,888,172 | B2 | | 5/2005 | Ghosh |
| 7,175,735 | B2 | | 2/2007 | Park et al. |
| 7,456,429 | B2 | | 11/2008 | Levy |

(Continued)

FOREIGN PATENT DOCUMENTS

| JP | 1985-030124 A | 2/1985 |
| JP | 11-56464 | 6/1989 |

(Continued)

OTHER PUBLICATIONS

Korean Intellectual Property Office, International Search Report and Written Opinion, International Patent Application No. PCT/US2011/045049, dated Feb. 22, 2012, 11 pages.

*Primary Examiner* — Gordon R Baldwin
*Assistant Examiner* — Yuechuan Yu
(74) *Attorney, Agent, or Firm* — Stoel Rives LLP

(57) ABSTRACT

Systems and methods for depositing a thin film on a flexible substrate involve guiding the flexible substrate along a spiral transport path back and forth between spaced-apart first and second precursor zones so that the substrate transits through the first and second precursor zones multiple times and each time through an intermediate isolation zone without mechanically contacting an outer surface of the substrate with a substrate transport mechanism, thereby inhibiting mechanical damage to the thin film deposited on the outer surface, which may improve barrier layer performance of the thin film.

37 Claims, 4 Drawing Sheets

(56) References Cited

U.S. PATENT DOCUMENTS

| | | |
|---|---|---|
| 8,137,464 B2 | 3/2012 | Dickey et al. |
| 8,178,168 B2 | 5/2012 | O'Neill et al. |
| 8,211,500 B2 | 7/2012 | Kojima et al. |
| 2002/0031645 A1 | 3/2002 | Sano et al. |
| 2002/0170496 A1 | 11/2002 | Ha et al. |
| 2003/0108674 A1 | 6/2003 | Chung et al. |
| 2003/0168001 A1 | 9/2003 | Sneh |
| 2003/0172873 A1 | 9/2003 | Fischer et al. |
| 2003/0232511 A1 | 12/2003 | Metzner et al. |
| 2004/0063320 A1* | 4/2004 | Hollars .................. 438/689 |
| 2004/0159285 A1 | 8/2004 | Doehler et al. |
| 2004/0195967 A1 | 10/2004 | Padiyath et al. |
| 2004/0201027 A1 | 10/2004 | Ghosh |
| 2005/0005846 A1* | 1/2005 | Selvamanickam et al. ... 118/718 |
| 2005/0172897 A1 | 8/2005 | Jansen |
| 2005/0249875 A1 | 11/2005 | Sasaki et al. |
| 2006/0073276 A1 | 4/2006 | Antonissen |
| 2007/0281089 A1 | 12/2007 | Heller et al. |
| 2008/0092814 A1 | 4/2008 | Yan et al. |
| 2010/0104996 A1* | 4/2010 | Yoshida .................. 432/121 |
| 2010/0143710 A1* | 6/2010 | Dickey et al. ............ 428/336 |
| 2010/0189900 A1 | 7/2010 | Dickey et al. |
| 2010/0215848 A1* | 8/2010 | Fukarek et al. ........... 427/177 |

FOREIGN PATENT DOCUMENTS

| | | |
|---|---|---|
| JP | 2005126756 A * | 5/2005 |
| WO | WO 2004/073893 A2 | 9/2004 |
| WO | WO 2006/042074 A2 | 4/2006 |

* cited by examiner

SUBSTRATE TRANSPORT MECHANISM CONTACTING A SINGLE SIDE OF A FLEXIBLE WEB SUBSTRATE FOR ROLL-TO-ROLL THIN FILM DEPOSITION

RELATED APPLICATIONS

This application claims the benefit under 35 U.S.C. §119 (e) from U.S. Provisional Patent Application No. 61/366,927, filed Jul. 23, 2010, which is incorporated herein by reference.

TECHNICAL FIELD

The field of the disclosure relates to thin film deposition, including atomic layer deposition (ALD), on flexible substrates.

BACKGROUND

U.S. patent application Ser. No. 11/691,421, filed Mar. 26, 2007, and published as Publication No. US 2007/0224348 A1 ("the '421 application"), which is incorporated herein by reference, describes a system and method for ALD in which a flexible substrate is transported back and forth between first and second precursor zones separated by an isolation zone into which an inert gas is injected to inhibit the migration of precursor gases out of the precursor zones.

U.S. patent application Ser. No. 12/980,234, filed Dec. 28, 2010, and published as Publication No. 2011/0159204 A1 ("the '234 application") which claims priority to U.S. Provisional Patent Application No. 61/290,826, filed Dec. 29, 2009 ("the '826 application"), both of which are incorporated by reference herein, describes a radical-enhanced ALD system in which monatomic oxygen radicals are generated from a compound oxygen-containing second precursor gas, such as $CO_2$, which is not reactive with a first precursor gas, such as trimethylaluminum (TMA). In the system of the '234 and '826 applications, the oxygen radicals are generated from the second precursor at a location upstream from and separated a sufficient distance from the first precursor zone such that the oxygen radicals recombine before migrating into the first precursor zone.

In certain embodiments of the '421, '234 and '826 applications, the substrate may be woven along a serpentine path around rollers or other turning guides spaced apart along the first and second precursor zones, as shown in FIGS. 1, 2, and 4 of the '421 application. This serpentine path configuration results in both sides of the substrate being contacted by the rollers as the substrate moves through the system. The present inventor has recognized that such mechanical contact can interfere with the ALD process, as it may disturb the chemisorbed precursor or result in mechanical damage to the coating and/or underlying substrate. This damage is generally caused by imperfections or particles on the surface of rollers, or by surface imperfections, such as bumps; spikes, general surface roughness, or particles on the surface of the substrate. When such features contact, the thin brittle oxide film may be broken, compromising its barrier properties.

The '421 application describes various turning guides as alternatives to rollers. One alternative described involves sprockets that utilize perforations along the margins of the web, as in camera film reels. Sprockets or other similar turning guides that contact the web along its edges may eliminate contact to most of the web surface. The present inventor has recognized that sprockets and similar turning guides may be difficult or economically impractical to implement when very thin and wide substrate web material is used, as is common in commercial food packaging applications, wherein polymer web on the order of approximately 1-4 meters wide and about 12 microns thick is common. Thin flexible polymer web substrate materials of the kind used for food packaging, having a thickness of less than approximately 25 microns ($\mu$m) and a width greater than approximately 200 mm, or thicker substrates having a thickness of approximately 25 to 200 microns and a width greater than about 300 mm, may sag, kink, crease, stretch or misfeed when not supported along substantially their entire width as they pass around the turning guides.

In another alternative described in the '421 application, the turning guides may comprise fluid bearings (e.g., gas bearings) that support the substrate on a dynamic cushion of fluid, such as precursor gas and/or inert gas injected through small perforations in a bearing race of the fluid bearing. However, fluid bearings are complicated and difficult to implement in practice.

DETAILED DESCRIPTION OF PREFERRED EMBODIMENTS

Figure 1:
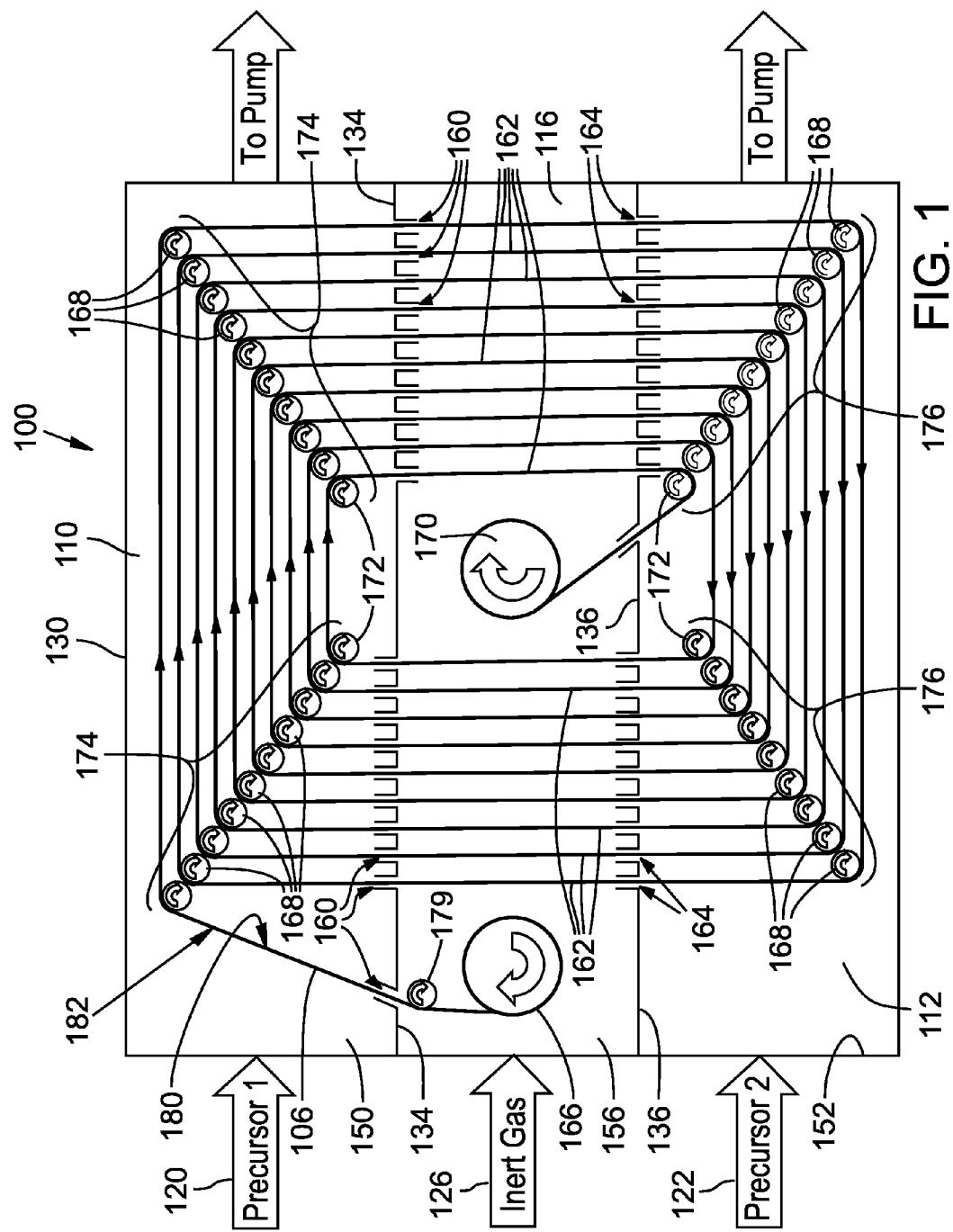
FIG. 1 is a schematic cross-sectional view illustrating a system and method for ALD on a flexible substrate in which a substrate is moved through a reaction chamber along a spiral transport path, in accordance with a first embodiment.

With reference to FIG. 1, a system 100 according to the present disclosure involves transporting a flexible web substrate 106 back and forth between first and second precursor zones 110, 112 along a spiral transport path (or "spiral path"). In system 100 shown in FIG. 1, an isolation zone 116 interposed between precursor zones 110, 112 contains an inert fluid (e.g., purge gas) to prevent precursors in precursor zones 110, 112 from mixing, as described in the '421 application. The inert fluid may comprise an inert liquid, but more preferably consists essentially of an inert gas, such as nitrogen ($N_2$) or $CO_2$. When in use, reactive first and second precursor gases (Precursor 1 and Precursor 2) are introduced into the respective first and second precursor zones 110, 112 from first and second precursor delivery systems 120, 122. Precursor delivery systems 120, 122 may include precursor source containers (not shown) located outside or within precursor zones 110, 112. Additionally or alternatively, precursor delivery systems 120, 122 may include piping, pumps, valves, tanks, and other associated equipment for supplying precursor gases into precursor zones 110, 112. An inert gas delivery system 126 is similarly included for injecting inert gas into isolation zone 116. Although delivery systems 120, 122, 126 are depicted in the schematic view of FIG. 1 as establishing a lateral gas flow, in some embodiments delivery systems 120, 122, 126 may establish a cross-flow across the width of substrate 106, i.e., a flow that is normal to the FIG. 1 page.

Precursor zones 110, 112 and isolation zone 116 are defined and bordered by an outer reaction chamber housing or vessel 130. Vessel 130 is divided by first and second dividers 134, 136 into three sub-chambers, namely, a first precursor chamber 150, a second precursor chamber 152 and an inert gas chamber 156. Vessel 130 may comprise a pressure vessel or vacuum vessel substantially isolating the process space from the external environment. In other embodiments, vessel 130 may have entrance and exit passageways for interfacing with other process modules or equipment.

To substantially prevent non-ALD reactions caused by mixing of non-adsorbed quantities of Precursors 1 and Precursor 2 in one of the chambers 150, 152, 156, system 100 inhibits the migration of Precursor 1 from first precursor zone 110 into isolation zone 116, and inhibits the migration of Precursor 2 from second precursor zone 112 into isolation zone 116. A series of first passageways 160 through first divider 134 are spaced apart to receive wound segments 162 of substrate 106, and a corresponding series of second passageways 164 are provided through second divider 136. Passageways 160, 164 are preferably configured to restrict the flow of gases between the zones 110, 112, 116, to avoid or limit diffusion of precursor gases into a common zone. For a web substrate, passageways 160, 164 preferably comprise slits having a width (exaggerated in FIG. 1) that is slightly greater than the thickness of substrate 106 and a length (not shown) extending into the plane of FIG. 1 (i.e., normal to the page) that is slightly greater than a width of substrate 106. Passageways 160, 164 may include slits sized only slightly thicker and wider than the thickness and width of substrate 106 passing through them, leaving only a very small amount of headroom and margins to allow substrate 106 to pass therethrough without scraping against the sides of passageways 160, 164. For example, headroom and margins may range between microns and millimeters in certain embodiments. Passageways 160, 164 may also include elongate tunnels through which substrate 106 passes. Such slits and tunnels are sometimes referred to as slit valves, although no actual moving valve gate is utilized. Passageways 160, 164 are arranged and configured for substrate 106 to be threaded therethrough back and forth between first and second precursor zones 110, 112 multiple times, and each time through isolation zone 116. Isolation zone 116 is, thus, preferably separated (albeit imperfectly) from first precursor zone 110 by first divider 134 and from second precursor zone 112 by second divider 136.

In an alternate embodiment (not shown), inert gas chamber 156 of isolation zone 116 and dividers 134, 136 are eliminated, so that isolation zone 116 essentially consists of a series of long narrow passageways extending completely between precursor zones 110, 112. In such an embodiment, no common inert gas chamber 156 connects the passageways, so inert gas is injected directly into the passageways medially of first and second precursor zones 110, 112 to help prevent precursor migration and mixing. Isolation zone 116 of this embodiment would include a manifold, or a number of manifolds, for routing inert gas lines to nozzles along the sides of the passageways. The manifold or manifolds would be formed in the material of the reaction chamber bordering the passageways, and may be connected to an inert gas delivery system along the sides of the system, or at an end of the system.

During ALD thin-film processing, the substrate 106 is unwound from a first roll 166. First roll 166 may include a removable spool (not shown) loaded onto a payout spindle (not shown) of system 100. Substrate 106 is wound along the spiral path defined by a progression of rollers 168 (or other turning guides) for multiple revolutions converging toward a central roll 170 or inner take-up spindle (not shown) proximal of the innermost turning guides 172. Central roll 170 may also include a removable spool (not shown) loaded onto the inner take-up spindle, in which a mechanical drive turns the payout and/or take-up spindle to wind (or reverses direction to unwind) substrate 106 around central roll 170. Rollers 168 may be idler rollers or mechanically driven, in which case they may be synchronously driven. Rollers 168 are positioned such that flexible substrate 106 transits back and forth through first and second precursor zones 110, 112 multiple times and each time through isolation zone 116. Accordingly, a first set of rollers 174 are diagonally located along first precursor zone 110, and a second set of rollers 176 are diagonally located in second precursor zone 112 directly opposite and mirroring first set of rollers 174. In some embodiments, first and/or second sets of rollers may be located within an isolation zone, or sets of rollers may be divided between precursor and isolation zones. An idler roller 179 is positioned in isolation zone 116, proximal to the first roll 166 to tension substrate 106 as it is unwound from first roll 166 and wound around the spiral path onto central roll 170. The progression of rollers 168 is arranged so that only a first side 180 of substrate 106 contacts rollers 168, and a second side or outer major surface 182 of substrate 106 opposite first side 180 is substantially free from mechanical contact with rollers 168. In other words, flexible substrate 106 is wound at an interior of the spiral transport path to inhibit outer surface 182 from mechanically contacting the substrate transport mechanism (i.e., rollers 168) and damaging the thin film formed on outer major surface 182. A thin film may also be deposited on first side 180 of substrate 106, albeit of inferior quality due to the contact of first side 180 with rollers 168.

During each revolution of substrate 106 around the spiral path, it is sequentially exposed to first precursor zone 110, isolation zone 116, and second precursor zone 112, thereby completing one ALD cycle, and then again to isolation zone 116 in preparation for the next revolution and the next ALD cycle. In the arrangement shown in FIG. 1, the residence time in each of the precursor zones 110, 112 changes on each revolution, as the distance traversed by substrate 106 between successive rollers 168 in the spiral path deceases. The number of ALD cycles is determined by the number of revolutions made by substrate 106 around the spiral path, and the total number of precursor zones traversed along the spiral path, as described with respect to FIG. 2, below.

When the system 100 and the wound substrate 106 are viewed along the rotational axes of rollers 168, as schematically shown in FIG. 1, the spiral path is akin to a spirangle, i.e., a spiral made out of substantially straight line segments instead of a continuous curve. The rectangular spirangle of FIG. 1 is formed from a set of straight web segments between successive rollers 168, with the succession of web segments arranged to converge to the central roll 170. In other embodiments, the spiral path may be in the shape of various other polygons other than a square. In any case, because of ALD's saturation characteristics, a uniform and high quality film of consistent thickness may be grown, despite the fact that the residence time in each of the precursor zones 110, 112 may be significantly different for each cycle, provided that the precursor dosing and purging exposure times for the shortest residence times of the innermost revolution of substrate 106 are sufficient to provide the required dosing and purging.

Figure 4:
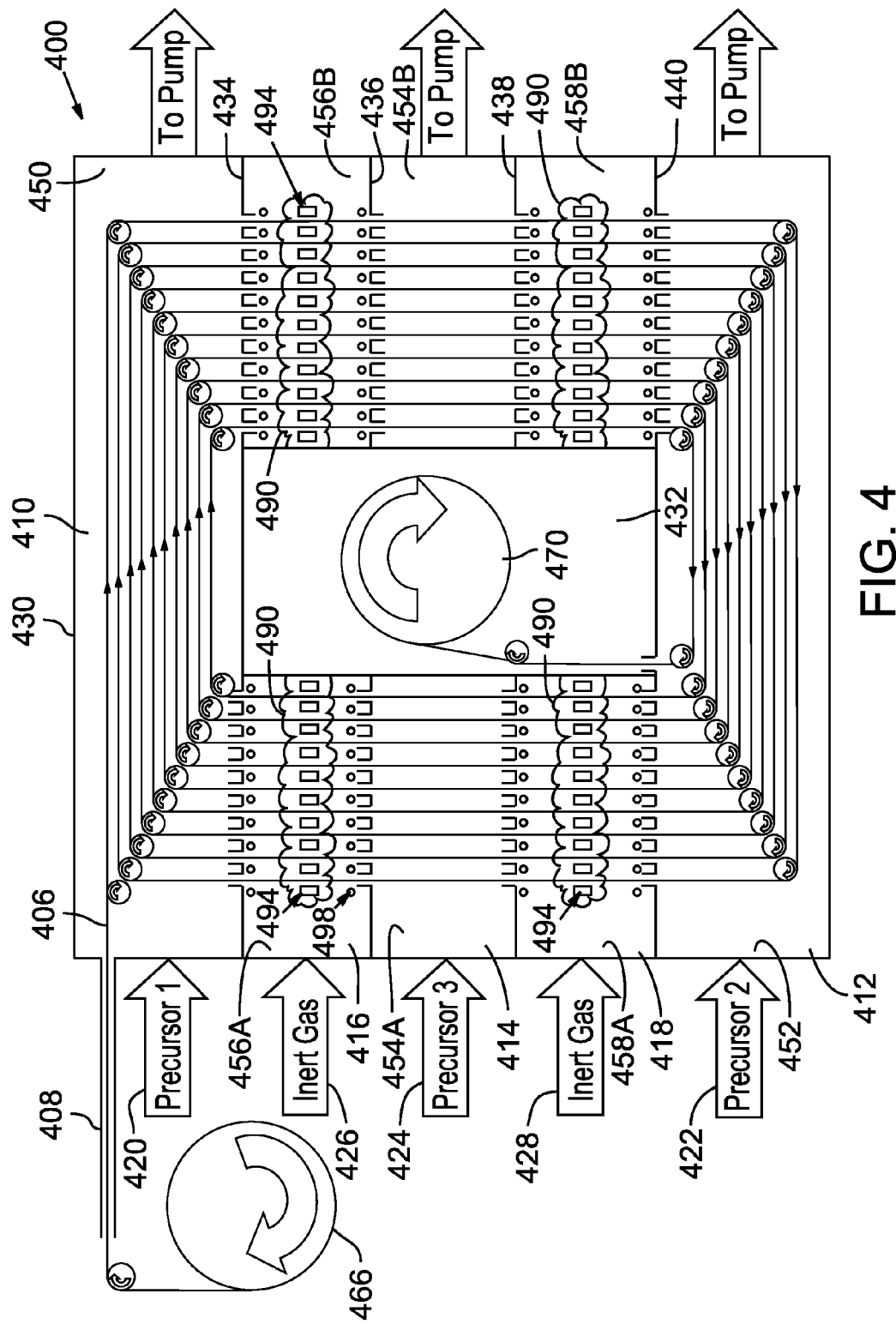
FIG. 4 is a schematic cross-sectional view illustrating a system and method for radical-enhanced ALD on a flexible substrate using a five zone stack configuration, in accordance with a fourth embodiment.

The spiral configuration also lends itself well to the concept of a double pass process, in which the central roll 170 acts as a "temporary" core. In such a process, the first roll 166 of a starting substrate is loaded onto a payout spindle at a location outside of the spiral transport path such as, for example, in a load lock (not shown) or adjacent an atmosphere-vacuum feedthough 408 (FIG. 4). As an alternative to venting reaction chamber or vessel 130, the load lock or atmosphere-vacuum feedthough 408 may be mounted to the outside of vessel 130 for atmosphere-to-vacuum staging. One suitable atmosphere-vacuum feedthough is manufactured by Energy Conversion Devices, Inc., of Auburn Hills, Mich. A "leader" of web may be used, which stays attached to central roll 170 and adapted in system 100 for multiple substrate coating runs. Each new roll of starting substrate material is attached to the leader in the load lock, then wound into the spiral transport path and onto central roll 170, before reversing the transport direction to feed substrate 106 back out of system 100 and onto first roll 166. Substrate 106 is then wound through the progression of rollers 168, onto central roll 170, and then the transport direction is reversed so that substrate 106 is rewound back onto first roll 166, providing two full passes through the complete system 100. Accordingly, a thin film coating is applied both as substrate 106 is rolled into system 100, as well as back out, thereby achieving the double pass process. By utilizing the leader web, loading a new substrate roll is simplified and all of the leading end of new substrate material is fully coated with the same number of ALD cycles, reducing waste. Of course, the trailing end of substrate of first roll 166 would not get fully coated, as the trailing end remains connected to a reel of the first roll 166 and would not complete the full number of revolutions through system 100 around the spiral path.

In order to degas, scrub, or remove water vapor proximal to substrate 106 as it enters and transits around the spiral path from first roll 166 to central roll 170, some embodiments may wind substrate 106 without any precursor gas in precursor zones 110, 112, i.e., with precursor delivery systems 120, 122 deactivated. After degassing and winding substrate 106 onto central roll 170, the precursor delivery systems 120, 122 are reactivated to inject Precursors 1 and 2 into precursor zones 110, 112, respectively. Upon introduction of Precursors 1 and 2 into precursor zones 110, 112, the transport direction is reversed and substrate 106 is transited back out of system 100 and onto first roll 166, thereby completing a single pass process.

The leader may be made of or coated with a special material that minimizes coating buildup on the leader. In particular, the leader may be made of or coated with a material including fluorine, such as PTFE (TEFLON®), which has been shown to prevent ALD film nucleation for many process chemistries. Leader materials or leader coating materials containing silicone, or other hydrophobic materials, or materials which inhibit formation of hydroxyl groups or chemisorption of ALD precursors may also be used to minimize or prevent coating buildup on the leader.

Figure 2:
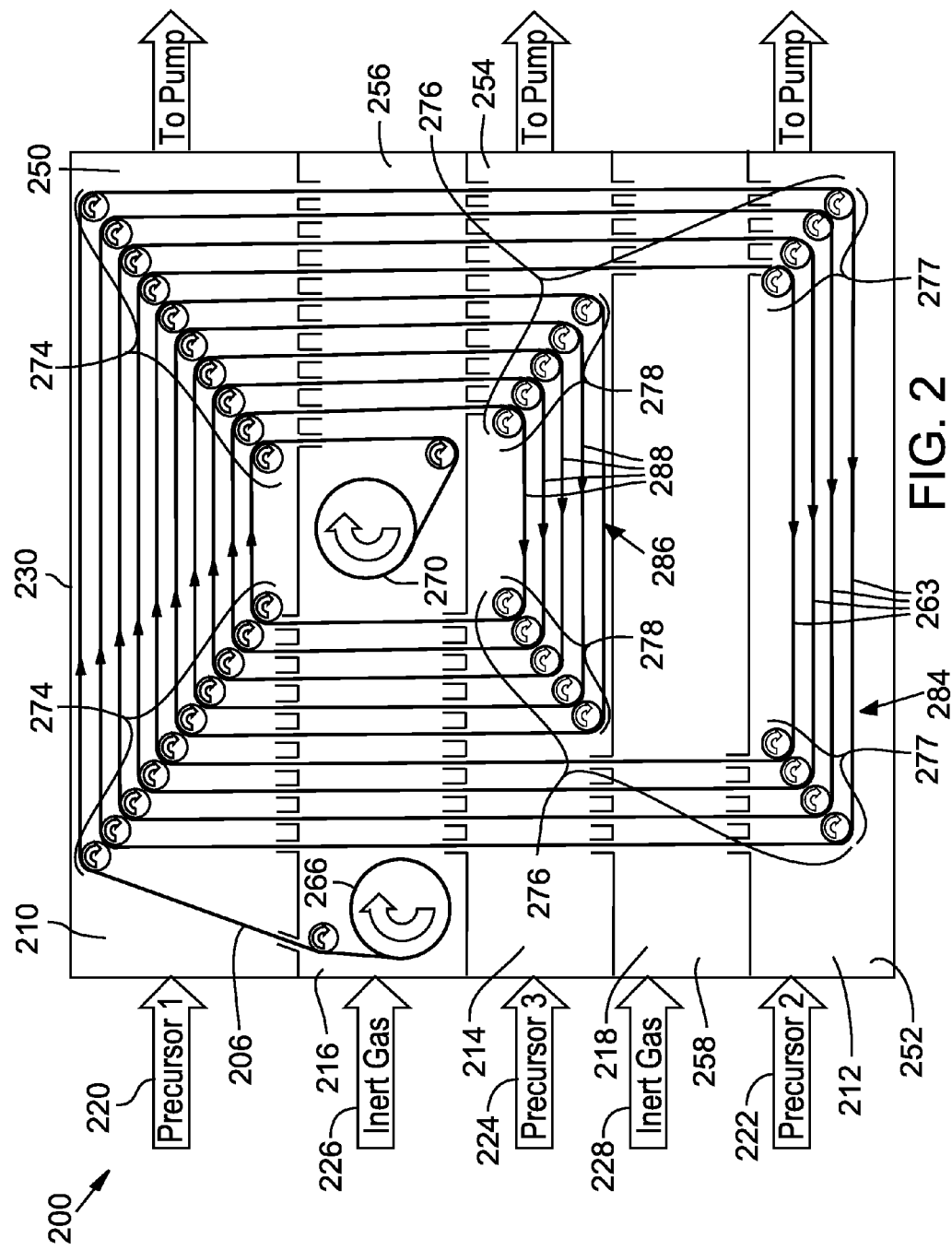
FIG. 2 is a schematic cross-sectional view illustrating a system and method for ALD, in accordance with a second embodiment, including an intermediate precursor zone providing a stack arrangement of three precursor zones for outermost substrate coils.

FIG. 2 illustrates a system 200 according to another embodiment, for coating a substrate 206. System 200 includes first and second precursor zones 210, 212, and a third precursor zone 214 located therebetween. Thus, system 200 provides a stack arrangement of the three precursor zones 210, 212, 214 separated by isolation zones 216 and 218. When in use, reactive first, second, and third precursor gases (Precursor 1, Precursor 2, and Precursor 3) are introduced into the respective first, second, and third precursor zones 210, 212, 214 from corresponding first, second, and third precursor delivery systems 220, 222, 224. Precursors 1-3 may be the same or different precursor gases, capable of producing more than one ALD cycle for each revolution on outermost substrate coils 263. As in system 100 of FIG. 1, system 200 includes a first set of rollers 274 that are diagonally located along first precursor zone 210. A second set of rollers 276 are (optionally) divided into a set of major-portion rollers 277 that are diagonally located in second precursor zone 212 and a set of minor-portion rollers 278 arranged in third precursor zone 214. Major-portion rollers 277 form an outer major spiral portion 284 spanning from the first to the second precursor zones 210 and 212, and extending through third precursor zone 214, thereby facilitating multiple ALD cycles on each outermost segment 263 per each revolution. Minor-portion rollers 278 form an inner minor spiral portion 286 such that innermost substrate segments 288 pass through a subset of the precursor zones, e.g., first and third precursor zones 210 and 214 (but not second precursor zone 212). Minor spiral portion 286 therefore facilitates exposure to one ALD cycle per each innermost revolution of innermost substrate segments 288. In some embodiments (not shown) minor-portion rollers may also be arranged within the second precursor zone 212, to produce multiple ALD cycles on each revolution of the substrate. In addition, a greater number of intermediate precursor zones may also be used in some embodiments.

Figure 3:
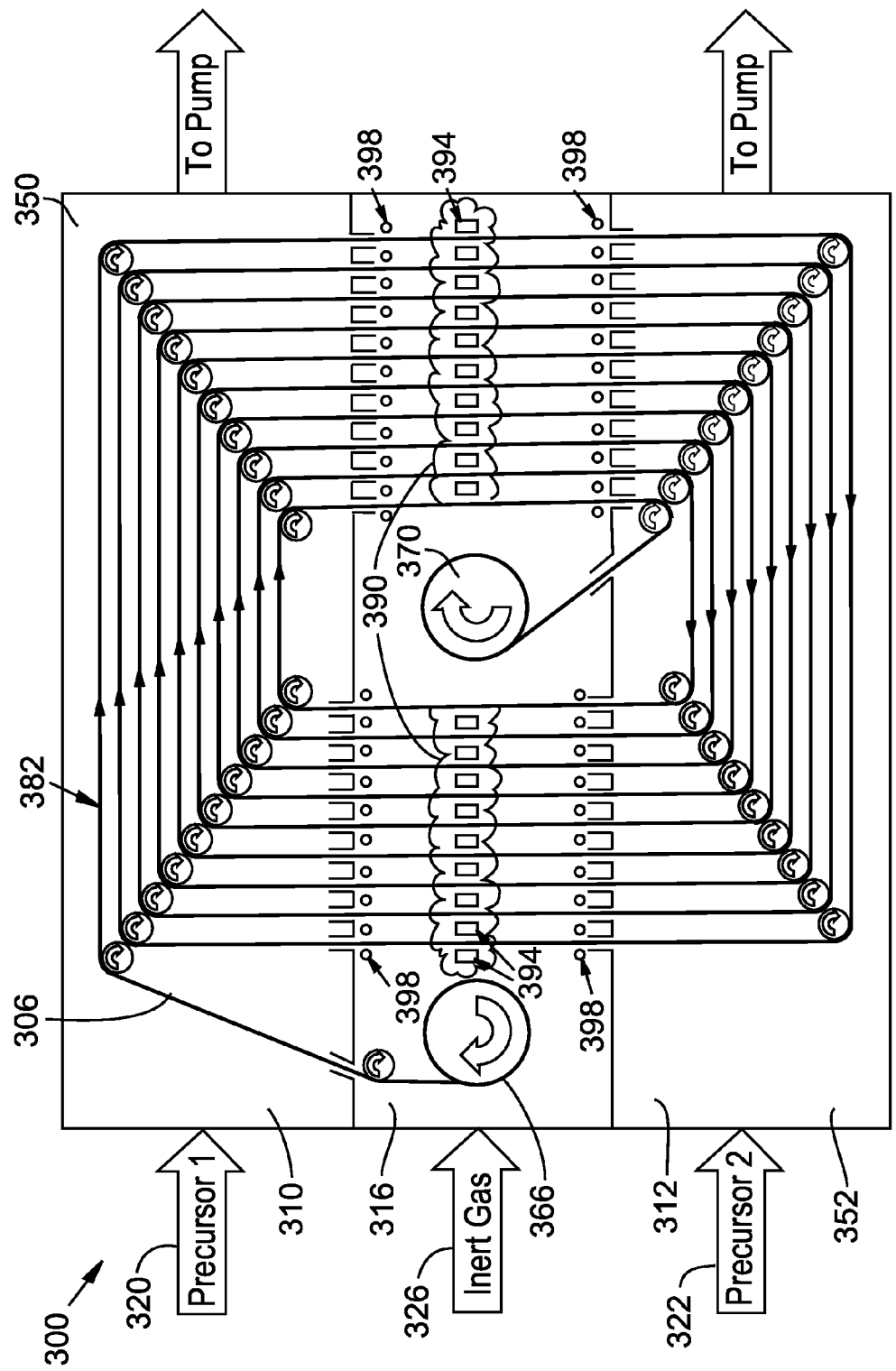
FIG. 3 is a schematic cross-sectional view illustrating a system and method including a plasma based process for ALD on a flexible substrate, in accordance with a third embodiment.

FIG. 3 illustrates a thin film deposition system 300 in accordance with another embodiment for depositing a thin film on a substrate 306 using a plasma based process of the kind described in the '826 and '234 applications, in which oxygen radicals or other radicals are utilized as a co-reactant precursor. In one radical-enhanced ALD configuration, TMA is introduced in first and second precursor zones 310, 312, and $CO_2$ is injected into an isolation zone 316 at a flow rate sufficient to achieve a differential pressure slightly higher than precursor zones 310, 312 to prevent migration of TMA precursor into isolation zone 316. To generate oxygen radicals that react with TMA molecules chemisorbed at an outer major surface 382 of substrate 306, a plasma 390 is generated in isolation zone 316 proximal of substrate 306. Plasma 390 is generated by a radicals generator 394 at a location spaced a sufficient distance from first and second precursor zones 310, 312 such that the oxygen radicals recombine before they can migrate into precursor zones 310, 312. In some embodiments utilizing radicals generator 394, the outer major surface 382 is exposed to gaseous radical species during each transit through one or more of the isolation and precursor zones 316, 310, and 312. In some embodiments, radicals may also be deactivated by an active radicals deactivation device 398, such as a vapor species that facilitates the deactivation, or by the use of materials that would react with the radicals to either trap or deactivate them, for example, a getter or a catalyst. In a system in which TMA is introduced into first and second precursor zones 310, 312 and oxygen plasma is generated from an inert gas in isolation zone 316, each revolution results in two ALD cycles. In the case of TMA and oxygen radicals (O.) generated from $CO_2$ plasma, a thin film of $Al_2O_3$ is deposited. In other embodiments, the radicals may be introduced in any one of the precursor zones.

When a plasma-enhanced technique is used (for example, using oxygen radicals as a co-reactant in isolation zone 316 with TMA precursor in both precursor zones 310, 312) each ALD cycle deposits approximately two angstroms (Å) of thin film onto substrate 306 so that one revolution of the substrate results in deposition of approximately 4 Å of material on substrate 306. A configuration with eight revolutions (not shown) would result in deposition of 32 Å of thin film as substrate unwinds from a payout roll onto a central roll, and another 32 Å of thin film as the substrate is reversed and wound back onto the payout roll for a total of approximately 64 Å of thin film, which is a sufficient thickness to provide barrier layer properties for food packaging applications.

The thin film deposited by the roll-to-roll ALD systems and methods described herein may be used in commercial food packaging applications for a polymer web on the order of approximately 1-4 meters wide and approximately 12 microns thick. Thin flexible polymer web substrate materials of the kind used for food packaging, having a thickness of less than about 25 microns ($\mu$m) and a width greater than approximately 200 mm, or thicker substrates having a thickness of 25 to 200 microns and a width greater than 300 mm, may also be used.

A thin film deposited by the roll-to-roll ALD method described herein, with roller contact on only one side of the substrate, and having a thickness of approximately 60 Å is expected to exhibit WVTR of better (less) than 0.5 g/m$^2$/day, when measured at 38 degrees Celsius, at 90% relative humidity.

EXAMPLE 1

Deposition of AL$_2$O$_3$ on PET substrate material:
1. Substrate width: approx. 3 meters.
2. Substrate thickness: 12 to 25 microns.
3. Substrate temperature: room temperature (~20° C.) to 120° C.
4. First precursor zone: TMA at 0.002 to 0.050 Torr partial pressure TMA.
5. Second precursor zone: Oxygen-containing plasma generated from CO$_2$ or a mixture of N$_2$ and O$_2$, with a total nominal pressure of 1.2 Torr.
6. Precursor exposure: the substrate travels between 5 cm and 500 cm within each of the plasma and the TMA-containing precursor zones on each revolution.
7. Web speed: 0.5 to 10 m/s.
8. Thin film growth rate expected: 1.5 to 2.0 Å per ALD process cycle (per revolution).
9. Number of revolutions: 10 per pass (10 each for payout and rewind).
10. Total coating film thickness expected: 3-4 nm (total for double pass).

The coating on the un-touched side is expected to have a WVTR of less than 0.5 g/m$^2$/day @ 38° C., 90% Relative Humidity. Under ideal conditions, the WVTR may be under 0.1 g/m$^2$/day. While the surface directly contacting the rollers may be coated, it would not be expected to provide a significant barrier contribution, relative to the untouched surface, due to mechanical damage.

Alternate configuration of Example 1: For the system described in the three paragraphs immediately preceding Example 1, above, a coating growth rate of 3-4 Å of Al$_2$O$_3$ per revolution is expected, resulting in approximately 6 nm total thickness using the double-pass described. The coating on the un-touched side is expected to have a WVTR of less than 0.5 g/m$^2$/day @ 38 ° C., 90% Relative Humidity. Under ideal conditions, the WVTR may be under 0.1 g/m$^2$/day. While the surface directly contacting the rollers may be coated, it would not be expected to provide a significant barrier contribution, relative to the untouched surface, due to mechanical damage.

EXAMPLE 2

Deposition of AL$_2$O$_3$ high barrier film on PEN substrate material:
1. Substrate width: approx. 2 meters.
2. Substrate thickness: 50-150 microns.
3. Substrate temperature: room temperature (~20° C.) to 200° C.
4. First precursor zone: TMA at 0.002 to 0.050 Torr partial pressure TMA.
5. Second precursor zone: TMA at 0.002 to 0.050 Torr partial pressure TMA.
6. Isolation zone: Oxygen-containing plasma generated from CO$_2$ or a mixture of N$_2$ and O$_2$, with a total nominal pressure of 1.2 Torr.
6. Precursor exposure: the substrate travels between 5 cm and 500 cm within each of the plasma and the TMA-containing precursor zones on each revolution.
7. Web speed: 0.1 to 5 m/s.
8. Thin film growth rate expected: 1.5 to 2.0 Å per ALD process cycle (3-4 Å per revolution).
9. Number of revolutions: 25 per pass (25 each for payout and rewind).
10. Total coating film thickness expected: approx 18 nm (total for double pass).

The coating on the un-touched side is expected to have a WVTR of less than 0.01 g/m$^2$/day @ 38° C., 90% Relative Humidity. Under ideal conditions, the WVTR may be under 0.001 g/m$^2$/day. While the surface directly contacting the rollers may be coated, it would not be expected to provide a significant barrier contribution, relative to the untouched surface, due to mechanical damage.

FIG. 4 illustrates a system 400 for depositing a thin film on substrate 406, in accordance with another radical-enhanced ALD embodiment. System 400 includes the previously discussed atmosphere-vacuum feedthrough 408, as well as first, second, and third precursor zones 410, 412, 414, with a first isolation zone 416 interposed between first and third precursor zones 410 and 414, and a second isolation zone 418 interposed between second and third precursor zones 412 and 414. When system 400 in use, reactive first, second, and third precursor gases (Precursor 1, Precursor 2, and Precursor 3) are introduced into the respective first, second, and third precursor zones 410, 412, 414 from first, second, and third precursor delivery systems 420, 422, 424. Inert gas is introduced into first and second isolation zones 416 and 418 from respective inert gas delivery systems 426 and 428. As mentioned previously, gases may be injected or introduced into the various zones in a direction normal to the page, flowing across the width of the flexible substrate.

Precursor zones 410, 412, 414 and isolation zones 416, 418 are defined and bordered by an outer reaction chamber or vessel 430 and a central roll housing or central chamber 432. Four dividers 434, 436, 438, 440 divide vessel 430 into five chambers. First and second precursor chambers 450, 452 are each continuations chambers; however, the internal arrangement of dividers 436 and 438, in conjunction with central roll housing 432 splits a third precursor chamber into a pair of sub-chambers or portions, namely, portions 454A and 454B. Inert gas chambers are also similarly divided into portions 456A, 456B, and portions 458A, 458B, respectively. "A" and "B" portions may be communicatively coupled via ducting.

Precursors 1-3 may be the same or different precursor gases. When a metal-forming precursor (e.g., TMA) is introduced into first, second, and third precursor zones 410, 412, 414 and an oxygen plasma 490 is generated by a radicals generator 494 from an inert gas in first and second isolation zones 416, 418, each revolution of substrate 406 about the spiral path results in four ALD cycles, improving the overall processing time. As with previously mentioned embodiments, additional zones are possible.

It will be obvious to those having skill in the art that many changes may be made to the details of the above-described embodiments without departing from the underlying principles of the invention. The scope of the present invention should, therefore, be determined only by the following claims.

The invention claimed is:

1. A system for depositing a thin film on a flexible substrate, comprising:
   a first precursor zone into which a first precursor gas is introduced when the system is in use;
   a second precursor zone into which a second precursor gas is introduced when the system is in use;
   an isolation zone interposed between the first and second precursor zones and into which an inert gas is introduced when the system is in use; and
   a substrate transport mechanism for reciprocally transporting the flexible substrate back and forth between the first and second precursor zones multiple times and each time through the isolation zone, including:
      an inner spindle;
      a plurality of first turning guides spaced apart along the first precursor zone, the first turning guides including at least an inner first turning guide and an outer first turning guide, the outer first turning guide offset outwardly from the inner first turning guide relative to the inner spindle,
      a plurality of second turning guides spaced apart along the second precursor zone, the second turning guides including at least an inner second turning guide and an outer second turning guide, the outer second turning guide offset outwardly from the inner second turning guide relative to the inner spindle, the first and second turning guides arranged for guiding the flexible substrate along a spiral transport path that extends around the inner spindle and passes through the first and second precursor zones multiple times,
   thereby inhibiting an outer surface of the flexible substrate from mechanically contacting the substrate transport mechanism.

2. The system of claim 1, further comprising a radicals generator in proximity to the spiral transport path for generating a gaseous radical species within at least one of the first precursor zone, the second precursor zone, or the isolation zone, to thereby facilitate exposure of the flexible substrate to the gaseous radical species.

3. The system of claim 2, wherein the radicals generator includes a plasma generator.

4. The system of claim 2, further comprising an active radicals deactivation device.

5. The system of claim 1, further comprising a third precursor zone into which a third precursor gas is introduced when the system is in use, the third precursor zone being interposed between the first and second precursor zones, and in which the isolation zone comprises a first isolation zone interposed between the first and third precursor zones and a second isolation zone interposed between the second and third precursor zones, and in which at least a portion of the spiral transport path extends into the third precursor zone.

6. The system of claim 5, further comprising a radicals generator within each of the first and second isolation zones.

7. The system of claim 1, in which each of the first and second turning guides includes a roller.

8. The system of claim 1, in which the substrate transport mechanism further comprises a payout spindle for paying out the flexible substrate from a roll located at a periphery of the spiral transport path.

9. The system of claim 1, in which the flexible substrate has a width greater than 200 mm and a thickness less than approximately 25 microns.

10. The system of claim 9, in which the flexible substrate has a width of approximately 1 meter to approximately 4 meters.

11. The system of claim 1, further comprising a leader having a first end portion coupled to the inner spindle, an opposing end portion configured to connect to the flexible substrate at a periphery of the spiral transport path, and a middle portion wound around the turning guides along the spiral transport path.

12. The system of claim 11, in which the leader is made of or coated with a material that inhibits ALD film nucleation upon the leader or formation of hydroxyl groups or chemisorption of ALD precursors on the leader.

13. The system of claim 12, in which the leader is made of or coated with a material selected from a group consisting of: materials containing fluorine, materials containing silicone, hydrophobic materials, and combinations thereof.

14. A system for depositing a thin film on a flexible substrate, comprising:
   a first precursor zone into which a first precursor gas is introduced when the system is in use;
   a second precursor zone into which a second precursor gas is introduced when the system is in use;
   an isolation zone interposed between the first and second precursor zones and into which an inert gas is introduced when the system is in use; and
   a substrate transport mechanism for transporting the flexible substrate along a spiral transport path back and forth between the first and second precursor zones multiple times and each time through the isolation zone, including:
      a plurality of first turning guides spaced along the first precursor zone,
      a plurality of second turning guides spaced along the second precursor zone, the first and second turning guides arranged to wind the flexible substrate into a spiral configuration comprising multiple spaced-apart coils, and
      an inner spindle proximal to innermost ones of the first and second turning guides and positioned for holding a roll of the flexible substrate at an interior of the spiral transport path,
   thereby inhibiting an outer surface of the flexible substrate from mechanically contacting the substrate transport mechanism.

15. The system of claim 14, further comprising a radicals generator in proximity to the spiral transport path for generating a gaseous radical species within at least one of the first precursor zone, the second precursor zone, or the isolation zone, to thereby facilitate exposure of the flexible substrate to the gaseous radical species.

16. The system of claim 15, wherein the radicals generator includes a plasma generator.

17. The system of claim 15, further comprising an active radicals deactivation device.

18. The system of claim 14, further comprising a third precursor zone into which a third precursor gas is introduced when the system is in use, the third precursor zone being interposed between the first and second precursor zones, and in which the isolation zone comprises a first isolation zone interposed between the first and third precursor zones and a second isolation zone interposed between the second and third precursor zones, and in which at least a portion of the spiral transport path extends into the third precursor zone.

19. The system of claim 18, further comprising a radicals generator within each of the first and second isolation zones.

20. The system of claim 14, in which each of the first and second turning guides includes a roller.

21. The system of claim 14, in which the substrate transport mechanism further comprises a payout spindle for paying out the flexible substrate from a roll located at a periphery of the spiral transport path.

22. The system of claim 14, in which the flexible substrate has a width greater than 200 mm and a thickness less than approximately 25 microns.

23. The system of claim 22, in which the flexible substrate has a width of approximately 1 meter to approximately 4 meters.

24. The system of claim 14, further comprising a leader having a first end portion coupled to the inner spindle, an opposing end portion configured to connect to the flexible substrate at a periphery of the spiral transport path, and a middle portion wound around the turning guides along the spiral transport path.

25. The system of claim 24, in which the leader is made of or coated with a material selected from a group consisting of: materials containing fluorine, materials containing silicone, hydrophobic materials, and combinations thereof.

26. A system for depositing a thin film on a flexible substrate, comprising:
  a first precursor zone into which a first precursor gas is introduced when the system is in use;
  a second precursor zone into which a second precursor gas is introduced when the system is in use;
  an isolation zone interposed between the first and second precursor zones and into which an inert gas is introduced when the system is in use; and
  a substrate transport mechanism for transporting the flexible substrate along a spiral transport path that winds back and forth between the first and second precursor zones multiple times and each time through the isolation zone, including:
    a plurality of first turning guides spaced along a first diagonal,
    a plurality of second turning guides spaced along a second diagonal, the first and second turning guides arranged to wind the flexible substrate along the spiral transport path, and
  an inner spindle proximal to innermost ones of the first and second turning guides and positioned for holding a roll of the flexible substrate at an interior of the spiral transport path, thereby inhibiting an outer surface of the flexible substrate from mechanically contacting the substrate transport mechanism.

27. The system of claim 26, further comprising a radicals generator in proximity to the spiral transport path for generating a gaseous radical species within at least one of the first precursor zone, the second precursor zone, or the isolation zone, to thereby facilitate exposure of the flexible substrate to the gaseous radical species.

28. The system of claim 27, wherein the radicals generator includes a plasma generator.

29. The system of claim 27, further comprising an active radicals deactivation device.

30. The system of claim 26, further comprising a third precursor zone into which a third precursor gas is introduced when the system is in use, the third precursor zone being interposed between the first and second precursor zones, and in which the isolation zone comprises a first isolation zone interposed between the first and third precursor zones and a second isolation zone interposed between the second and third precursor zones, and in which at least a portion of the spiral transport path extends into the third precursor zone.

31. The system of claim 30, further comprising a radicals generator within each of the first and second isolation zones.

32. The system of claim 26, in which each of the first and second turning guides includes a roller.

33. The system of claim 26, in which the substrate transport mechanism further comprises a payout spindle for paying out the flexible substrate from a roll located at a periphery of the spiral transport path.

34. The system of claim 26, in which the flexible substrate has a width greater than 200 mm and a thickness less than approximately 25 microns.

35. The system of claim 34, in which the flexible substrate has a width of approximately 1 meter to approximately 4 meters.

36. The system of claim 26, further comprising a leader having a first end portion coupled to the inner spindle, an opposing end portion configured to connect to the flexible substrate at a periphery of the spiral transport path, and a middle portion wound around the turning guides along the spiral transport path.

37. The system of claim 36, in which the leader is made of or coated with a material selected from a group consisting of: materials containing fluorine, materials containing silicone, hydrophobic materials, and combinations thereof.

* * * * *